Nov. 1, 1960 F. MURAL ET AL 2,958,771

SIGNAL-SEEKING RECEIVER

Filed Dec. 15, 1958

INVENTORS
FRANK MURAL
JOHN F. BOGUSZ
BY Fordyce A. Bothwell
ATTORNEY

United States Patent Office
2,958,771
Patented Nov. 1, 1960

2,958,771

SIGNAL-SEEKING RECEIVER

Frank Mural, Drexel Hill, and John F. Bogusz, Philadelphia, Pa., assignors to Philco Corporation, Philadelphia, Pa., a corporation of Pennsylvania Filed Dec. 15, 1958, Ser. No. 780,292

11 Claims. (Cl. 250—20)

Figures 1, 2:
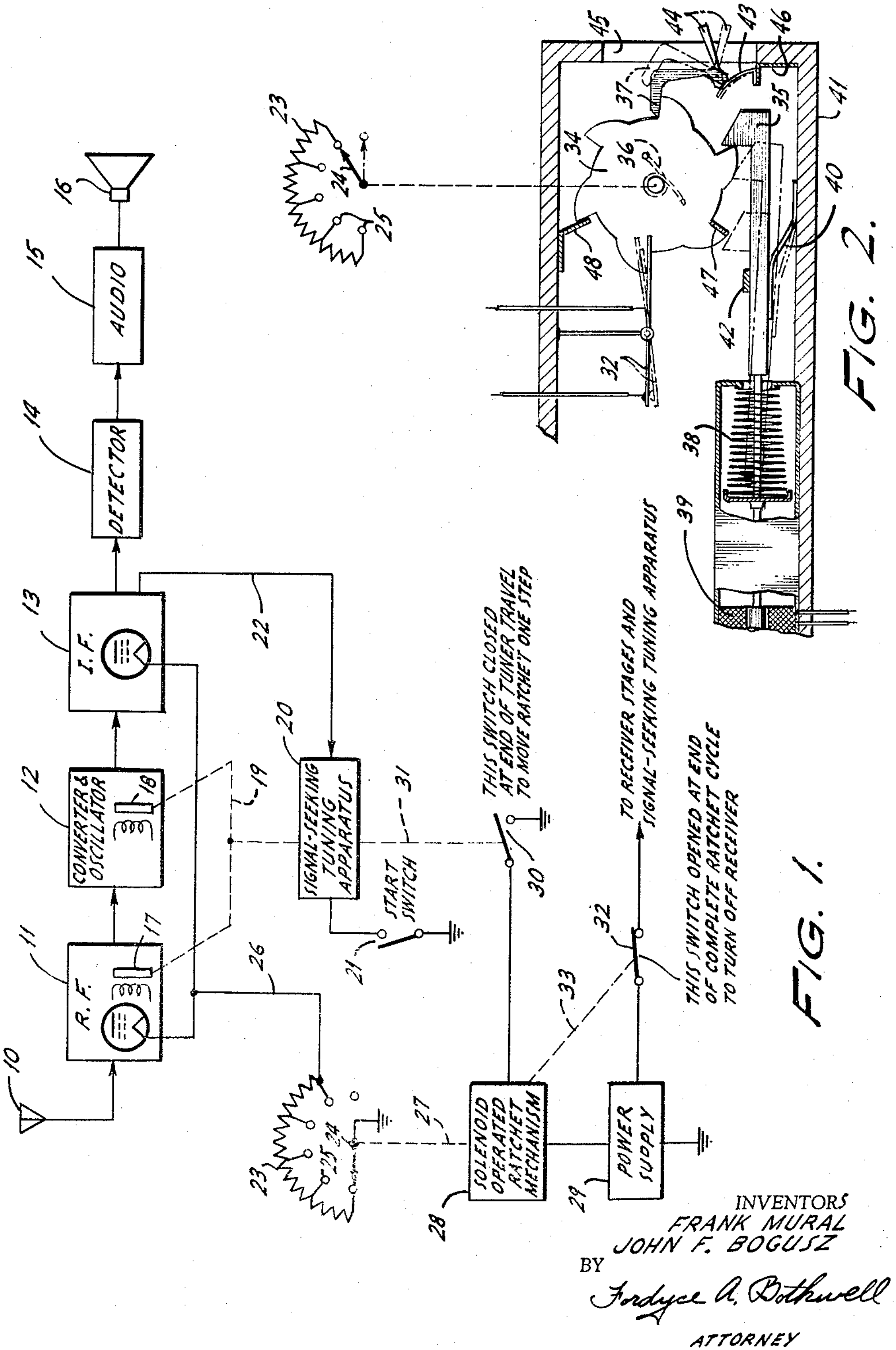

This invention relates to signal receivers of the signal-seeking type which function, in response to a starting operation, to effect automatic tuning to the next higher or lower frequency receivable signal in the reception band, depending upon the direction of tuning, the automatic tuning operation terminating when the receiver is properly tuned to said signal. Receivers of this type are now well known. They are particularly useful in vehicles, such as automobiles, as they require a minimum amount of attention on the part of the operator. In recent years an increasing number of automobile radio receivers have been of this type.

Regarding the direction of tuning, receivers of this type may be either bidirectional or unidirectional. In a bidirectional receiver the tuning motor is automatically reversed at each end of the band, and the automatic tuning takes place first in one direction and then in the other direction. In a unidirectional receiver, the signal-seeking tuning takes place in only one direction, and at the end of the tuning range the tuning mechanism is abruptly returned to starting position. In either case the tuning operation repeats until a signal is tuned in or until the signal-seeking operation is manually terminated.

In any signal-seeking receiver, it is desirable to make provision for adjustment of the receiver sensitivity, so that if a desired signal is not received on low sensitivity the sensitivity can be raised to bring in weaker signals. In the past, provision has been made for manual selection of different receiver sensitivities. Thus with the receiver sensitivity set at a certain level, if the signal-seeking operation fails to bring in a desired signal, the receiver sensitivity can be set higher. However, this requires additional manual operations on the part of the operator which are undesirable, especially in the case of an automobile radio receiver.

One object of the present invention is to provide for signal-seeking tuning operation with different receiver sensitivities without requiring any additional action on the part of the operator.

Another object of the invention is to provide an arrangement whereby signal-seeking operation takes place first with one level of receiver sensitivity, and if no suitable signal is tuned in, the signal-seeking operation is repeated automatically with a higher level of receiver sensitivity.

Still another object of the invention is to provide an arrangement whereby the receiver sensitivity is progressively increased step-by-step for successive signal-seeking tuning operations through the reception band.

Still another object of the invention is to provide for automatic receiver turn-off in the absence of a suitable signal on the highest useful sensitivity level, thus removing noise annoyance without attention from the operator.

The invention may be fully understood from the following detailed description with reference to the accompanying drawing, wherein Fig. 1 is a diagrammatic illustration of a signal-seeking radio receiver embodying the present invention; and Fig. 2 shows one form of ratchet mechanism which may be employed in the receiver of Fig. 1.

Referring first to Fig. 1, there is shown a conventional radio receiver comprising the antenna 10, the R.F. section 11, the converter and oscillator section 12, the I.F. section 13, the detector 14, the audio section 15, and the sound reproducer 16. The receiver tuning means may comprise movable magnetic cores 17 and 18 which are operable through a tuning range for tuning to signals within the reception band. As indicated by the dashed lines 19, the cores 17 and 18 are actuated by the signal-seeking tuning apparatus 20 which may take any of the known forms. For the present purpose, it may be assumed that the apparatus 20 is of the form disclosed in a copending application of J. E. Laschenski, Serial No. 468,008, filed November 10, 1954, now U.S. Patent No. 2,864,957 issued December 16, 1958. In that apparatus a core carriage is motor driven in one direction to tune through the reception band, and when the carriage reaches the end of its travel it is quickly returned to its starting position by a return spring. The signal-seeking tuning operation is initiated by momentary closure of a starting switch represented at 21. When the receiver is properly tuned to a receivable signal, the automatic tuning operation is terminated. This may be accomplished by deriving a stopping signal or signals from the I.F. section 13, as indicated by the connection 22. Suitable arrangements for this purpose are shown in a copending application of Ralph Bray, Serial No. 459,043, filed September 29, 1954, now U.S. Patent No. 2,880,311 issued March 31, 1959 and in a copending application of Ralph Bray, Serial No. 771,024, filed October 31, 1958.

In operation of a signal-seeking receiver, such as that illustrated, the signal-seeking tuning operation continues repeatedly until a received signal is tuned in or the tuning operation is manually stopped. As previously stated, in the past provision has been made for manual setting of the receiver sensitivity at different levels, so that in the absence of a desired signal sufficiently strong to be received with one setting of the receiver sensitivity, the receiver sensitivity can be increased to receive weaker signals.

In accordance with the present invention, provision is made for automatic increase of the receiver sensitivity after signal-seeking tuning has proceeded through the reception band, preferably after each tuning through the band. In the embodiment illustrated, there is provided a sensitivity control device comprising a tapped resistor 23 and an associated multi-position switch having a grounded movable contact arm 24 and stationary contacts 25. The sensitivity control is effected conveniently through the cathode-to-ground connection for one or more of the high frequency stages of the receiver, and in the illustrated embodiment as shown schematically the connection 26 extends from the cathodes of the tubes in the R.F. and I.F. sections 11 and 13 to the right-hand end of resistor 23. In the illustrated embodiment there are five sensitivity levels, but it will be understood that two or more such levels are contemplated.

As indicated by the dashed line 27, the movable contact 24 is actuated step-by-step by a solenoid operated ratchet mechanism 28 which is energized from the receiver power supply 29 whenever switch 30 is closed. This switch is controlled by the tuning apparatus 20, as indicated by the dashed line 31, and it is closed at the end of tuner travel to move the ratchet one step and thereby move contact arm 24 from one stationary contact 25 to the next stationary contact. For the present purpose, it has been assumed that the apparatus 20 is of the character disclosed in the aforementioned Laschenski patent. The switch 30 may be a simple normally-open switch arranged to be actuated by the moving carriage when it reaches the end of its travel and just before it is abruptly returned to starting position. For example, switch 30 may be a spring-biased normally-open push-button switch which is engaged by the moving carriage at the end of its travel.

Further in accordance with the present invention provision is made for turning off the receiver when the signal-seeking tuning operation has proceeded through the entire sequence of tuning with progressively increasing receiver sensitivity. For example, a normally-closed turn-off switch 32 may be actuated by the ratchet mechanism 28, as indicated by the dashed line 33, when the ratchet has gone through a complete operating cycle.

By way of example, the ratchet mechanism may be of the character shown in Fig. 2 wherein the ratchet wheel 34 is actuated step-by-step by an operating pawl 35 and is returned to zero or starting position by a return spring 36 whenever the pivoted holding pawl 37 is manually released. The ratchet wheel is shaft-connected to the contact arm 24 to drive the same, and for the purpose of receiver turn-off as hereinafter described, the ratchet wheel has a number of teeth which exceeds by one the number of sensitivity settings of the contact arm 24.

The operating pawl 35 is actuated by a compressible spring 38 and a solenoid 39. The pawl is resiliently supported by a leaf spring 40 affixed thereto and slidable along the bottom of casing 41, this arrangement permitting the pawl to ride over a ratchet tooth as it moves toward the right. The spring 38 urges the pawl toward the left against a stop 42. In operation, momentary closure of switch 30 energizes the solenoid 39 to move pawl 35 toward the right, compressing the spring 38. The latter then moves the pawl toward the left to actuate the ratchet wheel one step.

The ratchet wheel is held in its successive positions against the returning force of spring 36 by the holding pawl 37 until such time as the holding pawl is manually released. This pawl is biased by a leaf spring 43, and it is manually movable to either of the two over-center positions shown by means of an actuating finger 44 which projects through an opening 45 in the casing 41. As shown, the leaf spring 43 is a curved cantilever spring supported on a mounting bracket 46, and the lower end of the pivoted pawl 37 is tapered so as to form in cooperation with the spring 43 a toggle or over-center arrangement.

The receiver turn-off switch 32 may comprise a spring-biased pivoted contact arm which is normally in closed position and is engaged by a lateral extension 47 on one of the ratchet teeth to turn off the receiver at the end of a complete operating cycle of the ratchet. Thus after the final tuning through the reception band with contact arm 24 in the maximum receiver sensitivity position as shown in Fig. 2, the ratchet will step to a turn-off position represented in phantom, in which the extension 47 opens switch 32 and holds it open until the ratchet is reset to starting position by release of the holding pawl 37. The zero or starting position of the ratchet is established by a stop 48 which is engaged by the extension 47 when the ratchet wheel is returned by spring 36. When the ratchet wheel has returned to its starting position, the user actuates the holding pawl to its operative position.

Of course it will be apparent that the ratchet mechanism could operate switch 32 indirectly through the movable contact arm 24 instead of directly as shown. In such case, the switch 32 would be actuated by arm 24 when the latter moves to its final position out of circuit with resistor 23. In fact, the movement of contact arm 24 out of circuit with resistor 23 will render the receiver inoperative, but it will be realized that in the absence of a turn-off switch, the power supply would continue to supply voltage and current to the receiver components.

Considering the overall operation of the system as shown in Fig. 1, and assuming that the ratchet wheel is in starting position so that the contact arm 24 is in the first position as shown in Fig. 1, signal-seeking tuning may be initiated simply by momentarily closing the starting switch 21 as in the apparatus disclosed in the aforementioned Laschenski patent. Signal-seeking tuning will then take place through the reception band with minimum receiver sensitivity. If a signal is tuned in, the tuning will stop automatically and the user may continue to receive that signal if it is to his liking, or he may again actuate the starting switch to cause the tuning to proceed to the next receivable signal. In any case when the tuner reaches the end of its travel, switch 30 is momentarily closed to cause the ratchet to step to the next position and thus move contact arm 24 to its second position, thus increasing the receiver sensitivity to its next higher level. The signal-seeking tuning then proceeds again through the reception band, and again the user may receive any signal to his liking. In any case when the tuner reaches the end of its travel, the ratchet steps to its next position. The same operation is thus repeated for each receiver sensitivity setting of the movable contact arm 24 until the ratchet finally steps to the receiver turn-off position, as hereinbefore described. Then whenever the user decides to again initiate signal-seeking tuning, he resets the ratchet to starting position by releasing the holding pawl 37, and then returns this pawl to its operative position for the tuning operation to follow.

If the receiver is adapted for manual tuning as well as signal-seeking tuning, as is the receiver disclosed in the aforementioned Laschenski patent, a manual on-off switch may be connected in parallel with the switch 32, and a manual sensitivity selector device may be connected in parallel with the automatic sensitivity selector device. In such case the two devices may be selectively included in circuit simply by providing switches ganged with the manual on-off switch so that when the latter is open the automatic device is in circuit and the manual device is out of circuit, and when the on-off switch is closed the manual device is in circuit and the automatic device is out of circuit.

In the embodiment illustrated, during signal-seeking tuning the receiver sensitivity is automatically increased after each tuning operation through the reception band. However, if desired provision could be made for causing the tuning to be repeated at the same receiver sensitivity, so that after going through the band with a certain sensitivity setting the user, having sampled the signals receivable with that setting, could choose the signal to his best liking. Suppose, for example, that it were desired to have the tuning go through the band twice with each sensitivity setting. This would merely involve twice as many stationary contacts 25 with successive pairs connected to the tap points of the resistor 23, and additional teeth on the ratchet for proper stepping of the selector switch.

While the foregoing description has assumed that the signal-seeking receiver shown is of the unidirectional tuning type, it could just as well be of the bidirectional type. In such case, it is desired to actuate the ratchet 28 when the tuner carriage reaches the end of its travel in each direction. This merely requires that there be two normally-open switches instead of the single switch 30, one at each end of the tuner travel, connected in parallel so that closing of either switch will actuate the ratchet.

From the foregoing description it will be seen that the present invention provides a novel arrangement in a signal-seeking receiver whereby the operator has only to press a starting button momentarily to initiate signal-seeking tuning, and the tuning through the reception band will be repeated with progressive increase of receiver sensitivity. Moreover, in its preferred form the invention also provides the receiver turn-off feature.

While a particular embodiment of the invention has been illustrated and described, it will be understood that the invention is not limited thereto but contemplates such modifications and further embodiments as may occur to those skilled in the art.

We claim:

1. In a signal-seeking receiver including tuning means operable through a tuning range for tuning to signals within the reception band, signal-seeking tuning apparatus for actuating said tuning means repeatedly through said range, and means controlled by said tuning apparatus for automatically increasing the sensitivity of the receiver after signal-seeking tuning has proceeded through said range a predetermined number of times and before the next succeeding signal-seeking tuning operation through said range.

2. A signal-seeking receiver according to claim 1, wherein the last-recited means increases the receiver sensitivity after each signal-seeking tuning operation through said range.

3. In a signal-seeking receiver including tuning means operable through a tuning range for tuning to signals within the reception band, signal-seeking tuning apparatus for actuating said tuning means at least twice through said range, and means controlled by said tuning apparatus for automatically increasing the sensitivity of the receiver after the first signal-seeking tuning operation through said range and before the second signal-seeking tuning operation through said range.

4. In a signal-seeking receiver including tuning means operable through a tuning range for tuning to signals within the reception band, a signal-seeking tuning apparatus for actuating said tuning means repeatedly through said range, means operable to increase the sensitivity of the receiver in discrete steps, and means controlled by said tuning apparatus for actuating said sensitivity-increasing means after signal-seeking tuning has proceeded through said range a predetermined number of times and before the next succeeding signal-seeking tuning operation through said range.

5. In a signal-seeking receiver including tuning means operable through a tuning range for tuning to signals within the reception band, signal-seeking tuning apparatus for actuating said tuning means repeatedly through said range, means operable to increase the sensitivity of the receiver in discrete steps, solenoid-operated ratchet means for actuating said sensitivity-increasing means step-by-step, and switch means operable by said tuning apparatus to actuate said ratchet means after signal-seeking tuning has proceeded through said range a predetermined number of times and before the next succeeding signal-seeking tuning operation through said range.

6. A signal-seeking receiver according to claim 5, wherein said sensitivity-increasing means comprises a tapped resistor and a selector switch connected thereto.

7. In a signal-seeking receiver including tuning means operable through a tuning range for tuning to signals within the reception band, signal-seeking tuning apparatus for actuating said tuning means repeatedly through said range, means controlled by said tuning apparatus for automatically increasing the sensitivity of the receiver after signal-seeking tuning has proceeded through said range a predetermined number of times and before the next succeeding signal-seeking tuning operation through said range, and means operable by the last-recited means for automatically terminating the receiver operation after final signal-seeking tuning operation through said range with maximum receiver sensitivity.

8. In a signal-seeking receiver including tuning means operable through a tuning range for tuning to signals within the reception band, signal-seeking tuning apparatus for actuating said tuning means repeatedly through said range, means operable to increase the sensitivity of the receiver in discrete steps, means controlled by said tuning apparatus for actuating said sensitivity-increasing means after signal-seeking tuning has proceeded through said range a predetermined number of times and before the next succeeding signal-seeking tuning operation through said range, and means operable by the last-recited means for terminating the receiver operation after the final signal-seeking tuning operation through said range with maximum receiver sensitivity.

9. In a signal-seeking receiver including tuning means operable through a tuning range for tuning to signals within the reception band, signal-seeking tuning apparatus for actuating said tuning means repeatedly through said range, means operable to increase the sensitivity of the receiver in discrete steps, solenoid-operated ratchet means for actuating said sensitivity-increasing means step-by-step, switch means operable by said tuning apparatus to actuate said ratchet means after signal-seeking tuning has proceeded through said range a predetermined number of times and before the next succeeding signal-seeking tuning operation through said range, and switch means operable by said ratchet means for terminating the receiver operation after the final signal-seeking tuning operation through said range with maximum receiver sensitivity.

10. In a signal-seeking receiver including tuning means operable through a tuning range for tuning to signals within the reception band, signal-seeking tuning apparatus for actuating said tuning means repeatedly through said range, means operable to provide a predetermined number of receiver sensitivity settings, a rotatable ratchet wheel connected to said last means to drive the same in a direction to increase the receiver sensitivity, said wheel having a number of teeth which exceeds by one the number of said settings, means defining a zero or starting position of said wheel, an operating pawl associated with said wheel to actuate it step-by-step from said starting position, spring means urging said wheel in a reverse direction toward said starting position, a manually releasable holding pawl associated with said wheel to hold it in each position, means controlled by said tuning apparatus for actuating said operating pawl after signal-seeking tuning has proceeded through said range and before the next succeeding signal-seeking tuning operation through said range, and a normally-closed receiver turn-off switch arranged to be opened by the final stepping movement of said wheel.

11. A signal-seeking receiver according to claim 10, wherein said turn-off switch is directly actuated by the ratchet wheel through engagement by an element thereon.

References Cited in the file of this patent

UNITED STATES PATENTS

| | | |
|---|---|---|
| 2,614,213 | Tyman | Oct. 14, 1952 |
| 2,652,494 | Guyton | Sept. 15, 1953 |
| 2,832,889 | Kearney | Apr. 29, 1958 |